United States Patent [19]

Behi et al.

[11] Patent Number: 5,162,295
[45] Date of Patent: * Nov. 10, 1992

[54] SUPERCONDUCTING CERAMICS BY SEQUENTIAL ELECTRODEPOSITION OF METALS, FOLLOWED BY OXIDATION

[75] Inventors: Mohammad Behi, Jersey City; MacRae Maxfield, Plainfield; Ray Baughman, Morris Plains; Helmut Eckhardt, Madison; Zafar Iqbal, Morristown, all of N.J.

[73] Assignee: Allied-Signal Inc., Morristownship, Morris County, N.J.

[*] Notice: The portion of the term of this patent subsequent to Sep. 26, 2006 has been disclaimed.

[21] Appl. No.: 563,721

[22] Filed: Aug. 6, 1990

Related U.S. Application Data

[63] Continuation of Ser. No. 335,242, Apr. 10, 1989, abandoned.

[51] Int. Cl.$^5$ .............................................. H01L 39/24
[52] U.S. Cl. .......................................... 505/1; 205/51; 205/91; 205/92; 205/122; 205/170; 205/228; 205/234; 505/737; 505/818
[58] Field of Search ................... 505/1, 737, 818, 730; 204/40, 37.1, 58.5, 15; 205/51, 170, 176, 224, 228, 234, 236, 91, 92, 118, 122

[56] References Cited

U.S. PATENT DOCUMENTS

| | | | |
|---|---|---|---|
| 2,031,185 | 2/1936 | Stephenson | 204/38.1 X |
| 2,428,033 | 9/1947 | Nachtman | 204/41 X |
| 2,428,318 | 9/1947 | Nachtman | 204/41 X |
| 2,859,158 | 11/1958 | Schaer | 204/37.1 |
| 3,506,545 | 4/1970 | Garwin et al. | 204/15 |
| 3,524,800 | 8/1970 | Morrice et al. | 204/71 |
| 3,616,280 | 10/1971 | Arnold | 204/58.5 |
| 4,578,157 | 3/1986 | Halliwell et al. | 204/15 |

FOREIGN PATENT DOCUMENTS 241824 7/1988 Japan.

OTHER PUBLICATIONS

S. Jin et al., Appl. Phys. Lett., 52(19), pp. 1628-1630, 9 May 1988.
J. M. Rosamilia et al., J. Electrochem. Soc., vol. 136, No. 4, pp. 1053-1059, Apr. 1989.
F. A. Lowenheim, "Modern Electroplating", p. 463, (1974).
Gusmini et al., Commis. Energy At., Rapp. 1971 CEA-R4101.
Appl. Phys. Lett 52, 2077, (1988) A. Gupta et al., "Superconducting Oxide Films with High Transition Temperature . . . ".
Appl. Phys. Lett. 52, 2071, (1988), M. D. Kirk et al., "Scanning Tunneling Microscopy of the a-b Planes of $Bi_2(Ca,Sr)_3Cu_2O_{8+\delta}$ Single Crystal . . . ".
Appl. Phys. Lett. 52, 2068, (1988, A. Mogro-Campero et al., "Characterization of Thin Films of Y-Ba-Cu-O on Oxidized Silicon . . . ".
Appl. Phys. Lett. 52, 1992, (1988), B. T. Sullivan et al., "Bi-Sr-Ca-Cu-Oxide Superconducting Thin Films Deposited by dc Magnetron Sputtering".
Appl. Phys. Lett. 52, 1987, (1988), R. P. Gupta et al., "Y-Ba-Cu-O Superconducting Film on Oxidized Silicon".

(List continued on next page.)

Primary Examiner—John Niebling
Assistant Examiner—William T. Leader
Attorney, Agent, or Firm—Gerhard H. Fuchs; Richard C. Stewart

[57] ABSTRACT

The invention provides a method for forming deposits of superconducting ceramics by sequentially electrodepositing layers of metals, of a type and in proportion suitable for forming a superconducting ceramic, to form a precursor metal deposit, followed by oxidizing the precursor deposit to form a superconducting ceramic deposit. Optionally, the electroplating steps are conducted in such a manner that a patterned precursor deposit results, to obtain a patterned superconducting deposit after oxidation.

14 Claims, 3 Drawing Sheets

OTHER PUBLICATIONS

Appl. Phys. Lett. 52, 1904, (1988), J. W. C. de Vries, "Preparation, Patterning, and Properties of Thin $YBa_2Cu_3O_{7-\delta}$ Films".

J. Cryst. Growth, 85, 615 (1987), R. L. Henry et al., "Thin Film Growth of $YBa_2Cu_3O_x$ From Nitrate Solutions".

J. Cryst. Growth, 85, 619 (1987), A. S. Edelstein et al., "Formation of the Structure of the Superconducting Phase of La-Sr-Cu-O by dc Sputtering".

Appl. Phys. Lett. 51, 861 (1987), X. D. Wu et al., "Epitaxial Ordering of Oxide Superconductor Thin Films on (100) $SrTiO_3$ Prepared by . . . ".

Appl. Phys. Lett. 52, 1834 (1988), D. M. Hwang et al., "Transmission Electron Microscopy Studies of Superconducting Y-Ba-Cu-O Films Prepared by . . . ".

Ext. Abstracts, Mat. Res. Soc., Reno, Nev., Apr. 5-9 (1988), D. W. Capone et al., "High Temperature Superconductors II".

App. Phys. Lett. 52, 1743 (1988), A. D. Berry et al., "Formation of High $T_c$ Superconducting Films by Organometallic Chemical Vapor Deposition".

Jap. J. Appl. Phys. 27, L1265 (1988), Nakamori et al., "Superconducting Y-Ba-Cu-O Oxide Films by OMCVD".

Jap. J. Appl. Phys. 27, L1275 (1988), Yamane et al., "$T_c$ of C-Axis-Oriented Y-Ba-Cu-O Films Prepared by CVD".

Appl. Phys. Lett. 53, 406 (1988), D. S. Ginley et al., "Sequential Electron Beam Evaporated Films of $Tl_2CaBa_2Cu_2O_y$ with Zero Resistance at 97 K".

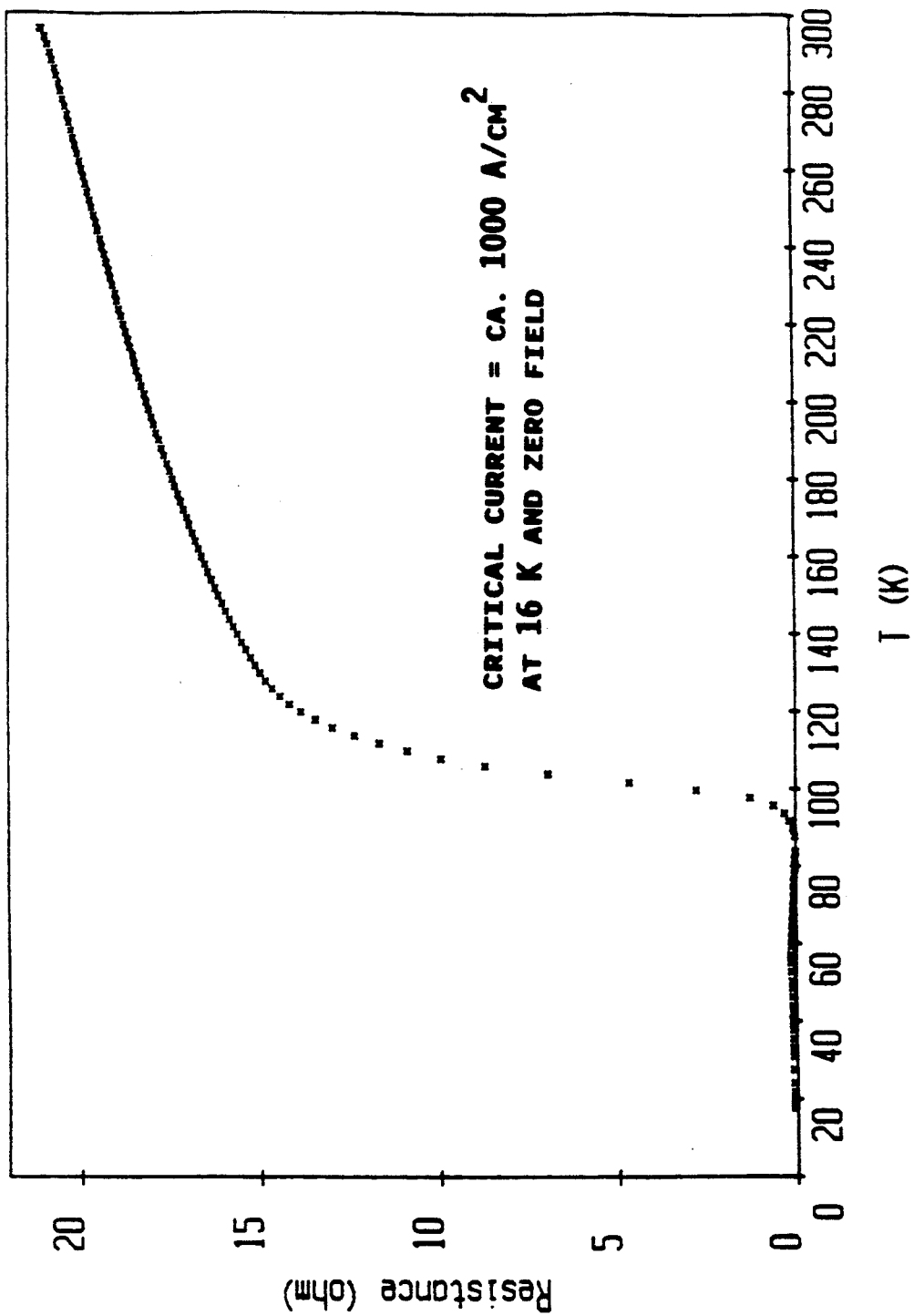

SUPERCONDUCTING CERAMICS BY SEQUENTIAL ELECTRODEPOSITION OF METALS, FOLLOWED BY OXIDATION

This application is a continuation of application Ser. No. 335,242 filed apr. 10, 1989, now abandoned.

CROSS-REFERENCE TO RELATED APPLICATIONS

This application is related to copending U.S. application Ser. No. 188,772, now U.S. Pat. No. 4,870,051, and application Ser. No. 188,772, now U.S. Pat. No. 4,879,270, both filed Apr. 29, 1988.

BACKGROUND OF THE INVENTION AND THE PRIOR ART

Many of the suggested uses of the recently discovered superconducting compounds, including superconducting ceramics composed of (Ba,Sr)-Rare Earth-Cu-O, require the application of the superconducting material as a thin film. One particular application is for electronic conductors in microelectronic circuits. Such thin films have previously been deposited on various substrates by methods such as: application of metal trifluoroacetate spin-on precursors [Appl. Phys. Lett. 52, 2077 (1988)]; electron beam co-evaporation of the metals [Appl. Phys. Lett. 52, 2072 (1988)]; multilayer evaporation process [Appl. Phys. Lett. 52, 2068 (1988)]; dc magnetron sputtering [Appl. Phys. Lett. 52, 1992 (1988)]; painting finely ground superconducting powder suspended in binder on the substrate, followed by annealing in oxygen [Appl. Phys. Lett. 52, 1987 (1988)]; triode sputtering [Appl. Phys. Lett. 52, 1904 (1988)]; application of nitrate solutions of the metals, followed by drying and annealing [J. Cryst. Growth 85, 615 (1987)]; reactive magnetron sputtering [J. Cryst. Growth 85, 619 (1987)]; excimer laser evaporation and deposition [Appl. Phys. Lett. 51, 861 (1987); Appl. Phys. Lett. 52, 1834 (1988)]; and organometallic chemical vapor deposition [Extended Abstracts, Materials Research Society, Reno, Nevada, April 5-9, 1988, "High Temperature Superconductors II, p. 141; Appl. Phys. Lett. 52, 1743 (1988); Jap. J. Appl. Phys. 27, L1265 (1988); and Jap. J. Appl. Phys. 27, L1275 (1988)].

Thin superconducting ceramic films can also be made by electrolytic co-deposition of metals, followed by oxidation (see the above-referred to copending U.S. patent applications).

Thin, unoriented, superconducting polycrystalline films in the Tl-Ca-Ba-Cu-O system have been prepared by sequential electron beam evaporation of multiple Tl, Ca, Ba and Cu layers, followed by a two-stage anneal under controlled Tl and oxygen overpressures [Appl. Phys. Lett. 53, 406 (1988)].

SUMMARY OF THE INVENTION

In accordance with the general aspect of the invention, there is provided a method for forming superconducting ceramics which involves the steps of (a) sequentially electrodepositing, onto a substrate, metals of a type and in proportions sufficient either alone or in combination with substrate metals, to be oxidized into superconducting ceramic; and (b) oxidizing said electrodeposited precursor metal deposit under conditions sufficient to result in said superconducting ceramic deposit.

In accordance with another aspect of the invention, the above-described method is conducted so as to provide a patterned superconducting ceramic deposit. By this expedient it is possible to provide electrical circuits, parallel arrays of superconducting wire, dots on substrates to serve as shields for electromagnetic radiation, and the like. Electrical circuits and other objects containing semiconductors, insulators or conductor elements with superconducting elements may be formed by employing the above described method in conjunction with lithographic or photolithographic procedures, or in conjunction with photoenhanced electrodeposition. For applications in which high spatial resolution is not required, patterned superconductor films can be obtained by means of employing patterned counterelectrodes in the electrodeposition step.

BRIEF DESCRIPTION OF THE DRAWINGS

Having briefly described the invention, the same will become better understood from the following detailed description, taken in conjunction with the attached drawings, wherein

FIG. 3 is a plot of resistance versus temperature of the film of Example 1 which was formed by sequentially depositing Tl, Ba, Ca, and Cu onto a Ag-coated MgO cathode substrate, and oxidizing the resulting film.

Figure 1:
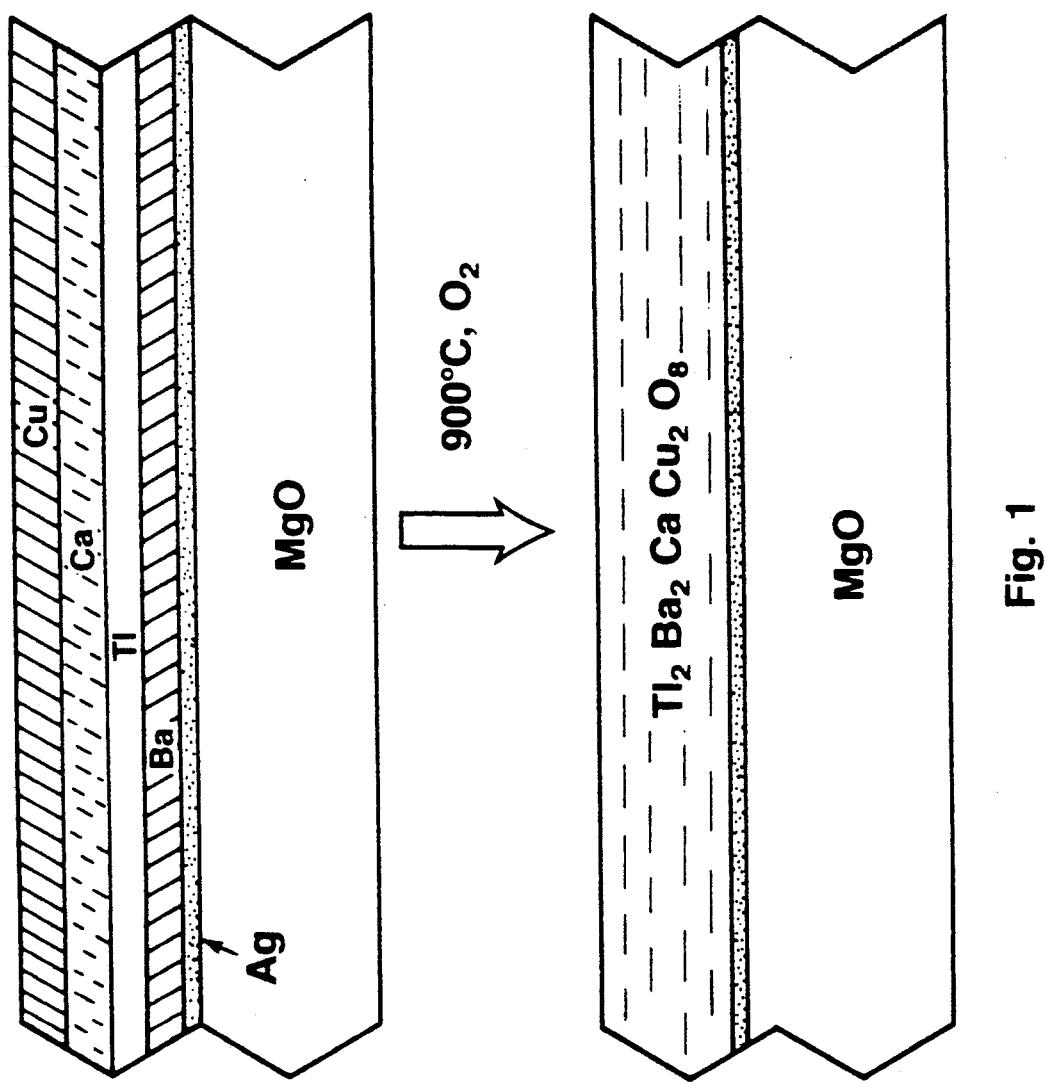
FIG. 1 is a general schematic diagram of a precursor layered electrodeposited metal deposit ready for interdiffusion and oxidation into a film of superconducting ceramic.

DETAILED DESCRIPTION OF THE INVENTION OF THE PREFERRED EMBODIMENTS, AND OF THE BEST MODE PRESENTLY CONTEMPLATED FOR ITS PRACTICE

The present invention involves a sequential plating process for forming superconducting articles which comprises electrodeposition of components of a superconductor precursor, optionally together with other desired components of the article, in a sequence of two or more steps, followed by thermal treatment to convert the precursor into a superconductor.

In the plating process, a layer of one or more of the metal components of the desired superconductor is electrodeposited on the electrically conductive surface of a substrate cathode, or a previously deposited layer. Each layer must be electrically conductive and formable by electrodeposition. It may consist of one or more metal species including constituents of a superconductor compound; additives for enhancing superconducting properties; and other constituents of the desired article. Generally, all of the constituent metals of the desired superconductor composition are deposited in the course of the electrodeposition steps but one or more such metals may pre-exist on the substrate cathode.

Following the plating process, the deposit is subjected to a thermal treatment to effect interdiffusion of the metal layers, and oxidation into the desired superconducting ceramic. Thermal treatment to effect interdiffusion may be carried out in the absence of oxygen. Thermal treatment to effect oxidation is carried out in an oxidizing environment. If the metal deposit contains components having relatively high vapor pressure at elevated temperature, such as thallium, for example, it will ordinarily be desirable to conduct the thermal treatment in an atmosphere containing vapor of such component in order to maintain the stoichiometry of the metal deposit.

In principle, there is neither a minimum nor maximum to the thickness of individual layers except that a layer must be (a) thick enough to provide even coverage over the deposited surface, and (b) thin enough to allow the constituents of the superconductor to interdiffuse through the thickness of a complete sequence of layers. The former criterion, whereby the scale of irregularities in the deposit does not exceed the diffusion distance of the deposited metal(s) during thermal processing, depends, largely, on the substrates, the type of deposit formed and the electrodeposition conditions. For example, very thin uniform layers may be obtained provided the deposited species forms with a dense structure; the substrate has high conductivity and simple geometry; the cation has high mobility; and the electrolyte does not substantially react with the deposit. The latter criterion depends, largely, on the combination of deposited species and resulting superconductor. All layers may be very thick, provided that either all the metals readily interdiffuse or that the combined deposit, or its oxide, melts during the thermal oxidation step. An individual layer may be thick provided that the constituent metal diffuses readily throughout the other components or superconductor oxide.

The practical range of the thickness of the individually deposited layer in each individual electrodeposition step is from about 0.01 micron to about 10 micron (about 0.00001 to about 0.01 mm). The preferred range is from about 0.05 micron to about 1 micron.

Figure 2:
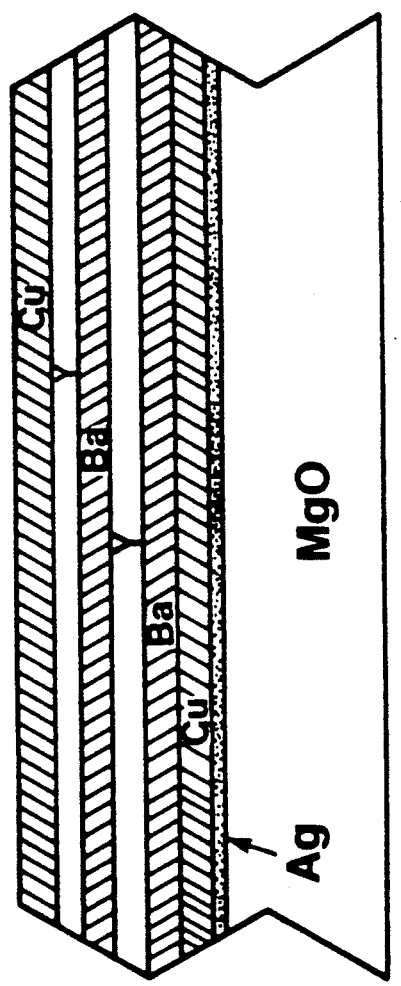
FIG. 2 is a general schematic diagram of such precursor deposit made up of multiples of layers of the type shown in FIG. 1.

The minimum overall thickness of the layered deposit prior to the thermal treatment is dictated by the minimum thicknesses of the individual layers. The maximum overall thickness is limited by the penetration of any components added during the thermal treatment that are necessary for conversion of precursor combinations into superconductor phases. The practical range of overall deposit thickness is from about 0.05 micron to about 100 micron. The preferred range is from about 0.5 micron to about 50 micron. Sequences of thin layers may be repeated to achieve a desired thickness, as is illustrated on FIG. 2.

The selection of initial and outer layers is sometimes important to preserving the stoichiometry of the superconductor precursor, even though specific ordering of the superconductor constituents is generally not critical since they interdiffuse during the thermal treatment. The initial layer is selected for its inertness to the substrate. As such, it is not depleted through reaction with the substrate, and it acts as a barrier between reactive inner layers and the substrate. Similarly, the outer layer is selected for its low volatility and low reactivity with the atmosphere. As such, it is not depleted through evaporation or parasitic reaction, and it can act as a barrier between the atmosphere and underlying volatile or reactive layers. These barrier layers may be superconductor constituents or may be other materials having barrier properties. For example, when superconducting Tl-Ba-Ca-Cu-oxide is prepared on a MgO substrate, the first layer should be Ba or a specific barrier layer, such as Ni, which is unreactive with MgO; all Tl-, Ba-, and Ca-containing layers should be internal, because Tl and its oxides are volatile at elevated temperatures, and Ba and Ca react with carbon dioxide to form carbonates. As a further sequencing consideration, juxtaposition should be avoided for layers which can combine to form highly stable non-superconductive compounds.

In the electrodeposition step, a reducing potential is applied to a conductive substrate while it is in contact with an appropriate electrolyte into which a counter-electrode is also immersed. Metals to be deposited from the electrolyte may include, but are not restricted to La, Y, Sm, Eu, Gd, Tb, Dy, Ho, Er, Tm, Yb, Lu, Th, Ba, Bi, Tl, Sr, Ca, Pb, Ce, Nd and Cu singly or in combination and quantities sufficient to form superconducting ceramics by oxidation. The preferred specific metals and specific proportions of these metals in the superconducting oxides are described in the prior art (Extended Abstracts of the Materials Research Society Spring Meeting in Anaheim, Calif., 1987). Other metals which functionally behave in the same manner can be substituted for the above, as will be readily apparent to those of ordinary skill in this art. In addition, other element which do not comprise part of a superconducting ceramic may be codeposited for the purpose of imparting enhanced mechanical, magnetic or electrical properties. Preferred elements for imparting improved mechanical properties are metals, such as silver, which do not substantially oxidize during formation of the superconductor.

Exemplary salts that may be included in the electrolyte are: $Y(NO_3)_3$, $Ba(PF_6)_2$, $Y(OC_3H_7)_3$, $Cu(OCOCH_3)_2$, $Bi(NO_3)_3$, $Pb(BF_4)_2$, $Tl(NO_3)_3$, $Tl(NO_3)$, $Sr(NO_3)_2$, $Ca(NO_3)_2$, $Pb(NO_3)_2$, $Cu(NO_3)_2$, $Eu(NO_3)_3$, $Ce(NO_3)_3$, and $Ba(NO_3)_2$.

The electrolyte solvent will ordinarily be an aprotic, non-aqueous solvent because non-noble metals, such as Ba, Ca, and Sr, react with water and other protic media. Such metals can neither be deposited from protic electrolytes, nor exposed to protic media during the deposition of more noble metals. Thus, non-noble metals would have to be overlaid by a more noble metal, e.g., Bi, Cu, Pb, and Tl, deposited from an aprotic electrolyte before using an aqueous electrolyte to apply a subsequent layer. Aside from this constraint, these and other more noble metals, which are useful as normal conductors and mechanical reinforcements (e.g., Au, Ag, and Ni), can be plated from aqueous electrolytes. Silver is a preferred layer component for providing normal state conductivity because of its unusually high diffusion coefficient of oxygen [Metals Handbook, 8th Edition, p. 1182, American Society of Metals, Metals Park, OH, (1961)]. Brighteners and other additives, such as aromatic sulfonates and EDTA, may be included in aqueous electrolytes to improve the structure of the deposit.

The potential applied to the cathode substrate may be selected for each electrolyte on the basis of optimum current density for forming uniform deposits, provided it is sufficient to reduce and deposit the desired species, but insufficient to contaminate the deposit through degradation of the electrolyte. For example, the potential applied for Ca deposition ranges from about $-3.2$ V vs. $Ag/Ag^+$ to a preferred limit of about $-5$ V; the potential for Cu deposition from a dimethyl sulfoxide (DMSO) electrolyte ranges from about $-0.1$ V to $-5$ V; the potential for deposition of a Cu-Ca mixture ranges from about $-1.5$ V to $-5$ V. The current densities range from about $10^{-3}$ mA/cm$^2$ to about $10^{+3}$ mA/cm$^2$; and preferred current densities range from about $10^{-1}$ mA/cm$^2$ to about 20 mA/cm$^2$.

The potential applied to a cathode may be varied with time in order to alter the deposit without changing the electrolyte or other electrolysis conditions. In mixed-salt electrolytes, the composition of the depositing species can be modulated by varying the potential between values that are sufficient to reduce all of the cation species present in the electrolyte, and values that are sufficient to deposit the more noble metals but not the less noble metals. Thus, the sequence of layers can include multiple layers formed from a single electrolyte. Pulsing the potential between two or more values may also be effective in forming smaller grains in the deposit structure by enhancing deposit nucleation.

Likewise, temperature, which also affects current density and wettability of the substrate, can be individually selected on the basis of deposit structure, provided ions remain mobile in the electrolyte. For example, the temperature range for DMSO electrolytes is from about $-40°$ C. to about 200° C. The preferred range is from about 10° C. to about 120° C.

A more noble metal such as copper can be deposited on an electroplated layer of a less noble metal, such as barium, without current flow. Such metal atom interchange results from the thermodynamically driven exchange of a metal having a highly reductive reduction potential (e.g., $Ba^{+2}$ at $-2.9$ V vs. normal hydrogen electrode) with a metal having a more positive reduction potential (e.g., copper at $+0.34$ V) hence, the present invention also comtemplates the method wherein one or more of the metals are deposited by metal atom interchange utilizing an electrolyte containing a salt having a more positive reduction potential. The amount of material deposited in a layer can initially be determined by direct measurement, e.g., weight uptake, for each electrolyte. It can also be calculated by the Equation $$M = (Q \times r)/z$$

where Q is the charge passed (total moles of electrons), z is the cation valency (moles of electrons per moles of cations), and r is the deposition efficiency for the electrolyte (moles of electrons involved in deposition per total moles of electrons passed). Under ambient conditions, 0.2 M solutions in DMSO exhibit efficiencies as follows: Cu - 1, Bi - 1, Pb - 1, Ca - 0.92, Sr - 0.81.

The metal layers are electrodeposited onto a substrate which is electrically conductive and not harmful to the resultant ceramic. Electrode substrate materials may be metallic, semiconductive, or photoconductive. They may be free standing such as conductive plates, rods, wires, fibers, grids, and foils, or supported by structural material such as conductive thin films of metals, conductive oxides, and semiconductors coated on ceramics. The electrode substrates may be virtually any size, shape, and number as long as the electrolyte in contact with the surfaces to be coated is also in contact with a counter electrode. The electrode substrate can consist of or include a metal or metal containing composition which reacts with the electrodeposited metal during oxidation to form the superconductor. For some applications it is desirable to utilize the electrode substrate as the sole source of one of the metals required for formation of the superconductor. This requires interdiffusion of substrate and deposited metals. For purposes of such interdiffusion, post-deposition thermal annealing can be used. A preferred example is electrodeposition of all the metals in the superconductor except for copper onto a low denier copper wire or thin copper foil. Oxidation of the substrate containing electrodeposited metals then yields the superconductor in wire or foil form. For the purpose of obtaining oriented growth of the superconductor phase, and thereby obtaining enhanced critical currents, substrate electrode geometries which provide preferential crystal growth directions can be used. One such convenient substrate electrode geometry is obtained by grooving the electrode surface with parallel lines. The substrate material can also be chosen as one which will disappear via sublimation or gasification under the oxidation conditions, so as to result in a substrate-free superconductor.

The counter electrode and other auxiliary electrodes useful in this method are electrically conductive solids such as metals, semiconductors, and photoconductors. They may be inert or electroactive under the conditions of electrodeposition. Those that are electroactive may be useful as sources to the electrolyte of cations of metals being deposited. Counter electrodes with high electrical conductivities (above 100 S/cm) are preferred in order to minimize resistive energy losses during electroplating.

Aside from rinsing the film to remove residual electrolyte, there is no essential treatment between layers. In cases where deposits form with an open granular structure, mechanical compression of the film assists uniform deposition of subsequent layers, and interdiffusion of constituents during the thermal treatment.

Once it is confirmed that the deposit consists of the metals in question in the preferred yield, the substrate is then heated in an oxidizing environment, usually an oxidizing atmosphere, up to a temperature and for a time sufficient to oxidize the deposited metals into the superconducting ceramic state. Either prior to or following this oxidation step, it is sometimes desirable to utilize other thermal or chemical treatments known in the art in order to enhance the properties of the superconductor. For example, melting and resolidification of the as-formed superconductor can be employed to provide enhanced critical currents via enhanced preferential alignment of crystallite grains in the superconductor.

The present sequential deposition procedure can readily be employed to produce patterned superconducting films. For example, electrical circuits and other objects containing semiconductors, insulators, or conductor elements with superconducting paths may be formed utilizing the present procedure in combination with conventional lithography or in combination with photoinduced enhancement of electrodeposition Such combinations can be particularly useful in forming parallel arrays of superconducting wires and dots such as those useful as high efficiency transparent shields of electromagnetic radiation. For applications in which high spatial resolution is not required for the superconductor elements of a circuit or array, patterned superconductor films can arise from electrodeposition using patterned counterelectrodes.

Selective area electrochemical deposition of the superconductor precursor alloys can be conveniently accomplished using a modification of the lithography techniques conventionally employed to form circuits of metallic and semiconducting elements. An insulating photoresist is deposited (for example, by solution or gas deposition) on the electrode substrate. In one embodiment, a positive photoresist coating on a cathode substrate may be irradiated in selected areas (to make those areas soluble), and developed by solvent treatment to expose conductive cathode in those areas. Alternatively, a negative photoresist coating may be irradiated in selected areas (to make those areas insoluble), and developed to expose cathode surface in non-irradiated areas only. In either case, subsequent electrodeposition leads to the formation of superconductor precursor only in areas of the cathode where the insulating layer of photoresist has been removed.

The metal alloy composition which is precursor to the superconductor can also be electrochemically deposited in a patterned form on an electrode using photo-induced enhancement of electrochemical deposition. For this purpose, the most convenient photon source is a high energy laser which is scanned across the electrode surface to generate the patterned alloy deposition. Depending upon the selected photon frequency, the electrolyte, and the target electrode surface, the mechanism of the photo enhanced electrochemical deposition varies. For example, relatively low photon fluxes can be used to generate photocarriers in a photoconductor present at the electrode surface. The resulting current flow through the photoconductor then generates the patterned alloy deposition. Alternately, the photon source can provide patterned alloy deposition by selective volume heating of either the electrolyte or the electrode surface, so as to provide increased current flow at points of irradiation. Patterned deposition on a photoconductor surface can also result from patterned exposure to penetrating radiation, such as x-rays. Hence, it is possible to generate a patterned deposition of the superconductor on surface areas which are inaccessible to either visible or ultraviolet radiation.

Photoinduced electrodeposition is a well known procedure. Use of a laser to enhance metal deposition over small areas is a simple means for producing the small metal patterns in electronic circuitry, thereby doing away with need for the overlaid "masks" that are used in fabricating conventional photolithographic circuits. This method employs a finely focused laser beam to heat a small surface area of the electrode whereon the metal is deposited. The heated area of the electrode heats the surrounding electrolyte, thereby raising its ionic conductivity [see, for example, Chem. & Eng. News, Oct. 29, 1979, p. 7, and Appl. Phys. Lett. 35, 651–653, (1979)].

Modification of the photoenhanced electrochemical deposition can be used to conveniently generate parallel superconducting wires having separations comparable with the wavelength of light. The modified approach utilizes the alternating stripes of intense light and near-zero light intensity resulting from the interference of two light beams. This pattern of illumination generates, via selected area photoenhancement of current flow, the patterned deposition of superconductor precursor alloy. Note that oxidation of the thereby obtained precursor alloy wires can provide the additional advantage of oriented growth of the superconductor as a consequence of the shape anisotropy of the precursor alloy. Such oriented growth is preferred for improving the properties of the superconductor, and specifically for increasing the critical current.

For applications in which high spatial resolution is not required for the patterned formation of superconductor on a substrate, it is possible to utilize a patterned counter electrode or patterned motion of a counter electrode (having dimensions much smaller than the pattern desired on the electroplated electrode). Patterned deposition by means of patterned counterelectrodes is a well-known approach to achieve selective deposition. In electrodeposition, the metal ions within the electrolyte move in response to the applied electric field. The process of electrodeposition is largely a field effect and, assuming adequate agitation within the plating bath, the applied electric field varies inversely with the separation between the cathode and anode. Hence, the deposition rate on the cathode is greatest in areas closest to the anode and low or negligible in areas distant from the anode. This field effect makes patterned deposition by use of patterned counterelectrodes possible. Use of a patterned counterelectrode will, of course, not provide as fine a resolution as is obtainable by photoinduced enhancement of electrodeposition.

Patterned electrochemical deposition of the superconductor precursor alloy on a transparent electrode substrate, using the above-described methods, permits preparation of an optically transparent superconductor. The patterning, such as an array of parallel strips or a two-dimensional dot array of either the superconducting or the superconductor-free areas, provides for optical transparency. Such transparent films can find applications as windows which have high efficiency for the shielding of radio frequency and microwave frequency radiation. Use of a two-dimensional dot array of superconductor can provide for a film which is superconducting in the film thickness direction and insulating in the plane of the film.

The electrode whereon the superconductor precursor alloy is electroplated can be in the form of a moving belt or wire (or disk or drum) which passes continuously sequentially from electroplating solution to electroplating solution and in close proximity to the counter electrode. (Passage of the wire through the center of a cylindrical counter electrode is preferred in the latter instance.) If desired, the belt (or wire) can then pass from the last electroplating solution in the series into a chamber for thermal treatment in an oxidizing atmosphere to provide the high temperature superconductor. If thick coatings of the superconductor are desired, the belt (or wire) can pass continuously between the series of electroplating baths and the oxidation chamber, and/or chambers for thermal annealing in an inert atmosphere.

In contrast with other conventional methods of forming thin films by evaporation or sputtering, the electrochemical approach is well suited for deposition of the superconductor precursor alloy on complicated shapes and interior surfaces of articles. For example, the precursor alloy to the superconductor can be deposited on the inside surface of a pipe by filling the pipe with electrolyte, centrally locating the anode in the pipe, and utilizing the inner surface of the pipe as the cathode for electrochemical deposition. Transformation of the precursor alloy into the superconductor is then conveniently accomplished by heat treatment of the pipe in an oxygen-containing atmosphere.

Having generally described the invention, the following examples are intended to be illustrative but not limiting in any manner.

EXAMPLE I

A superconducting film of $Tl_2Ba_2CaCu_2O_8$ was formed by thermally oxidizing a precursor film consisting of electrodeposited layers of the constituent metals, Tl, Ba, Ca, and Cu. The layers were formed on a silver-coated MgO cathode substrate by sequentially electrodepositing one metal at a time from four separate electrolytes, each comprised of an 0.2 M solution of the nitrate salt of one of the metals dissolved in dimethylsulfoxide (DMSO). In each electrolyte, a potential of −5 V vs a Ag/Ag+ reference electrode was applied to the substrate in order to reduce the cations to their neutral state causing them to deposit on the substrate. The amount of charge passed during the deposition of each metal was sufficient to deposit a stoichiometric amount of the metal. The sequence of metals and charge passed were as follows:

| metal | coul./cm$^2$ | valence |
|---|---|---|
| Ba | 0.55 | 2 |
| Cu | 0.8 | 2 |
| Ca | 1.07 | 2 |
| Cu | 0.8 | 2 |
| Ba | 0.55 | 2 |
| Tl | 0.55 | 1 |
| film compressed | | |
| Tl | 0.55 | 1 |
| Ba | 0.55 | 2 |
| Cu | 0.8 | 2 |
| Ca | 1.07 | 2 |
| Cu | 0.8 | 2 |
| Ba | 0.55 | 2 |

| metal | total charge per metal | molar ratio |
|---|---|---|
| Tl | 1.10 | 2 |
| Ba | 1.10 | 2 |
| Ca | 1.07 | 2 |
| Cu | 1.60 | 3 |

After deposition, the film was rinsed in THF, dried and enclosed loosely in gold foil. The film was heated three times in P$_2$ (at 860° C. for 1 m, 910° for 0.5 m, and 910° for 1 m) and quenched after each heating. The films XRD pattern indicated that Tl$_2$Ba$_2$CaCu$_2$O$_8$ was the majority phase. Its resistivity exhibited metallic behavior above 120 K and dropped to zero by ca. 93 K. The critical current at 16 K and zero field was estimated to be ca 1000 A/cm$^2$.

EXAMPLE II

A superconducting film consisting primarily of Tl$_2$Ba$_2$CaCu$_2$O$_8$ was formed as in Example I except that a different sequence of metals was employed. In this case, the metals deposited on an Ag-coated MgO cathode substrate, and the charge passed were as follows:

| metal | coul./cm$^2$ | valence |
|---|---|---|
| Tl | 0.55 | 1 |
| Ba | 0.55 | 2 |
| Cu | 0.8 | 2 |
| Ca | 1.07 | 2 |
| Cu | 0.8 | 2 |
| Ba | 0.55 | 2 |

| metal | total charge per metal | molar ratio |
|---|---|---|
| Tl | 0.55 | 2 |
| Ba | 0.55 | 2 |
| Ca | 0.54 | 2 |
| Cu | 0.8 | 3 |

After each deposition, the film was compressed using a roller. After depositing the metals in the above sequence, the film was rinsed in tetrahydrofuran (THF), dried, and enclosed loosely in gold foil. The enclosed film was heated at 860° C. in one atmosphere of O$_2$ for one minute and quenched. The film's x-ray diffraction (XRD) pattern indicated that the majority phase was Tl$_2$Ba$_2$CaCu$_2$O$_8$ with 001 texture (the c-axis normal to the substance surface).

EXAMPLE III

A superconducting film of YBa$_2$CuO$_{7-x}$ was formed by thermally oxidizing a precursor film consisting of electrodeposited layers of the constituent metals, Y, Ba, and Cu. The layers were formed on an Ag-coated MgO cathode substrate by sequentially electrodepositing one metal at a time from three separate electrolytes, each consisting of a 0.2 M solution of the nitrate salt in DMSO. A potential of −5 V vs Ag/Ag+ was applied to the cathode in each electrolyte in order to form a deposited layer. The sequence of metals deposited and the charge passed were as follows:

| metal | coul./cm$^2$ | valency |
|---|---|---|
| Cu | 3 | 2 |
| Ba | 4 | 2 |
| Cu | 3 | 2 |
| Y | 3 | 3 |

After depositing the sequence of metals, the film was rinsed in THF, dried, heated at 900° C. for 5 m, 500° C. for 30 m, and 410° C. for 12 h in an atmosphere of oxygen. According to its XRD pattern, the resulting film was composed, principally, of YBa$_2$CuO$_{7-x}$ with Y$_2$O$_3$ and CuO as minor fractions. The transition in its resistivity onset at ca. 90 K and went to zero at ca. 17 K.

Since various changes may be made in the invention without departing from its spirit and essential characteristics, it is intended that all matter contained in the description shall be interpreted as illustrative only and not in a limiting sense, the scope of the invention being defined by the appended claims.

We claim:

1. The method of forming high temperature superconducting ceramics comprising:
    (a) forming an electrodeposited precursor metal deposit containing the constituent metals of said superconducting ceramic in proportions sufficient to be oxidized into said superconductor ceramic comprising sequentially electrodepositing, onto a substrate, metals of the type suitable for forming said superconducting ceramic, said metals including at least one or more of La, Y, Sm, Eu, Gd, Tb, Dy, Ho, Er, Tm, Yb, Lu, Th, Ba, Bi, Tl, Sr, Ca, Ce and Nd deposited from an aprotic liquid; and
    (b) oxidizing said electrodeposited precursor deposit under conditions sufficient to result in said superconducting ceramic.

2. The method of claim 1, wherein the electroplating steps are conducted in such a manner that a patterned precursor deposit results, with said oxidation step being conducted on said patterned deposit to result in a patterned superconducting deposit.

3. The method of claim 2, wherein patterned deposit is obtained by lithographically depositing a photoresist in patterned manner on said substrate, and thereafter conducting said electrodepositing steps.

4. The method of claim 2, wherein patterned deposition is obtained by means of photoinduced enhancement of electrodeposition by scanning a photon source over the substrate surface to thereby generate patterned deposition.

5. The method of claim 2, wherein the metal layers which are individually deposited have a thickness of from about 0.01 to about 10 micron, and said resultant precursor layer containing said metals in proportions sufficient to be oxidized into superconducting ceramic has a thickness of from about 0.05 to about 100 micron.

6. The method of claim 1, wherein the metal layers which are individually deposited have a thickness of from about 0.01 to about 10 micron, and said resultant precursor layer containing said metals in proportions sufficient to be oxidized into superconducting ceramic has a thickness of from about 0.05 to about 100 micron.

7. The method of claim 1, wherein said aprotic liquid is selected from the group consisting of dimethyl sulfoxide, dimethyl formamide, dimethoxyethane and tetrahydrofuran.

8. The method of claim 20, wherein the metals which are deposited in step (a) comprise thallium, barium, calcium and copper, wherein said metals are deposited from solutions of their nitrates, and wherein the ceramic deposit resulting after oxidation step (b) is a superconducting film of $Tl_2Ba_2CaCU2O_8$.

9. The method of claim 8, wherein the aprotic liquid is dimethylsulfoxide.

10. The method of claim 1, wherein the metals which are deposited in step (a) comprise yttrium, barium and copper, and wherein the ceramic deposit resulting after oxidation step (b) is a film of Y-Ba-Cu-O superconductor.

11. The method of claim 10, wherein said metals are electrodeposited from solutions of their nitrates in an aprotic solvent.

12. The method of claim 1, wherein at least two, but not all of said metals are combined in an electrolyte for electrodeposition, and are deposited in a single electrodeposition.

13. The method of claim 1, wherein in the electrodeposition step one or more metals are deposited which are not constituent parts of the ceramic super conductor.

14. The method of claim 13, wherein said metals which are not constituent parts of the ceramic superconductor include silver.

* * * * *